United States Patent [19]
Wojslawowicz

[11] 3,867,651
[45] Feb. 18, 1975

[54] MONOSTABLE SWITCHING CIRCUIT

[75] Inventor: Jack Edward Wojslawowicz, Bayonne, N.J.

[73] Assignee: RCA Corporation, New York, N.Y.

[22] Filed: Sept. 28, 1973

[21] Appl. No.: 401,878

[52] U.S. Cl. ............ 307/273, 307/252 C, 307/265, 307/284

[51] Int. Cl. ............ H03k 3/26

[58] Field of Search ......... 307/273, 284, 252 C, 265

[56] References Cited

UNITED STATES PATENTS

| | | | |
|---|---|---|---|
| 3,085,165 | 4/1963 | Schaffert et al. | 307/273 |
| 3,204,123 | 8/1965 | Mahoney et al. | 307/284 |
| 3,271,700 | 9/1966 | Gutzwiller | 307/284 |
| 3,282,632 | 11/1966 | Arsem | 307/273 |
| 3,321,674 | 5/1967 | Felcheck et al. | 307/284 |
| 3,332,031 | 7/1967 | Reid | 307/284 |
| 3,343,046 | 9/1967 | Ladd, Jr. | 307/252 C |
| 3,343,104 | 9/1967 | Motto, Jr. | 307/284 |
| 3,365,588 | 1/1968 | Tussing | 307/264 |
| 3,458,730 | 7/1969 | Gamblin | 307/273 |
| 3,745,382 | 7/1973 | Hoge et al. | 307/284 |

OTHER PUBLICATIONS

"Long Delay Monostable Multivibrator" by Foy, Jr. in RCA Tech. Notes, RCA TN No. 620, March, 1965, pages (2 sheets).

*Primary Examiner*—Stanley D. Miller, Jr.
*Attorney, Agent, or Firm*—H. Christoffersen; S. Cohen

[57] ABSTRACT

A gate controlled switch is connected in series with a load across a source of direct current operating potential. A feedback path between the switch and a capacitor enables the capacitor to receive a controlled charging current when the switch is triggered into a first conductive state in response to a first polarity trigger signal. A diac coupled between the capacitor and the switch applies an opposite polarity trigger signal to the switch when the capacitor voltage exceeds a threshold value. The opposite polarity trigger signal places the switch in a second conductive state whereupon the feedback signal is effective to discharge the capacitor.

16 Claims, 2 Drawing Figures

MONOSTABLE SWITCHING CIRCUIT

This invention relates to monostable switching circuits and particularly to such circuits employing thyristors as switching elements.

Monostable switching circuits, as the term is used here, refers to those circuits capable of providing a momentary turn-on or a momentary turn-off of a load current in response to an input signal. In some applications it is desirable that the on-time or the off-time (output pulse width) be substantially independent of the load current. In other applications it may be desired that the pulse width be controlled, for example, by an externally supplied control signal. Still other applications require a monostable switching circuit capable of relatively fast recovery to allow substantially immediate retriggering after termination of the output signal. The present invention is directed to a monostable switching circuit meeting the needs above and employing a thyristor to achieve high circuit sensitivity.

In accordance with the present invention a monostable switching circuit includes a bistable electronic switch for connection in circuit with a load and a source of operating potential. The switch, initially in a first conductive state, is triggered to a second conductive state in response to a trigger signal of one polarity. A control circuit, responsive to the state of the switch, provides an opposite polarity trigger pulse to the switch a predetermined time after the switch is triggered to the second state to return the switch to its first conductive state.

Figure 1:
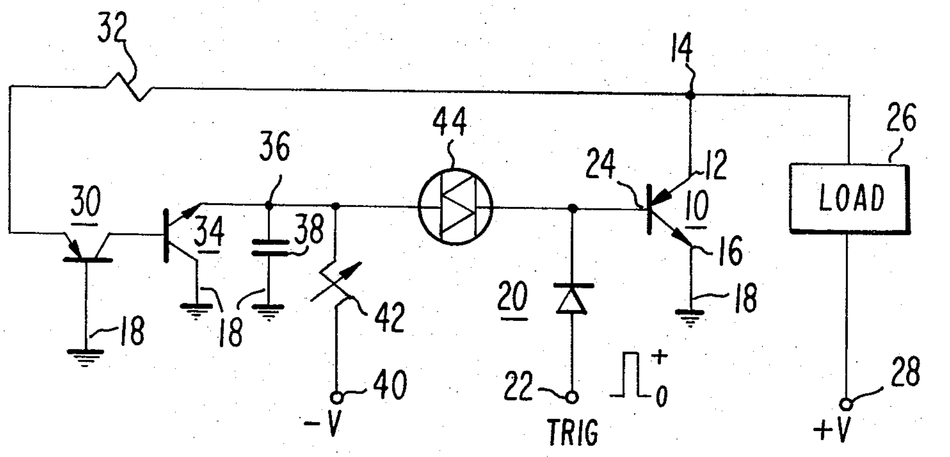
Figure 2:
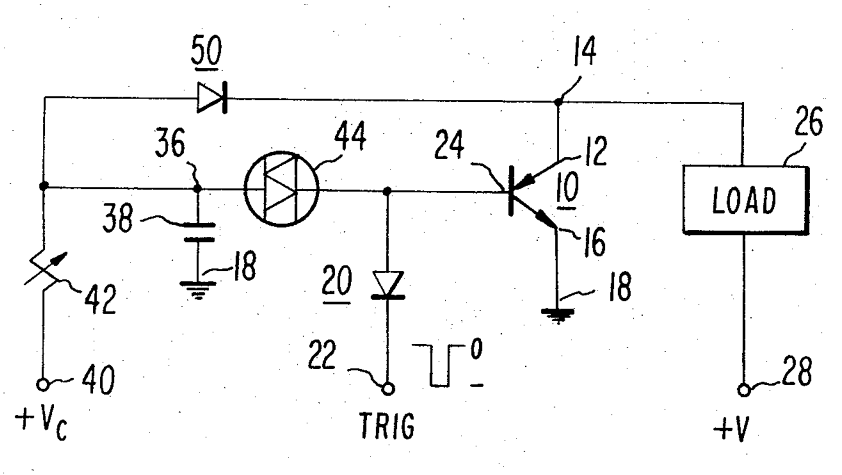

The invention is illustrated in the accompanying drawings, of which FIGS. 1 and 2 are circuit diagrams of preferred embodiments thereof and wherein like reference symbols designate like elements.

In FIG. 1 a gate controlled switch (GCS) 10 is connected at its anode terminal 12 to circuit point 14 and at its cathode terminal 16 to ground reference point 18. Diode 20 is connected at its cathode to trigger terminal 22 and at its anode to gate terminal 24 of thet GCS. Load 26 is connected between circuit point 14 and operating potential terminal 28 which is supplied with a potential +V relative to ground reference point 18.

An example of a GCS suitable for use as GCS 10 in the present invention is the RCA A-5000B. Although a GCS is preferred to perform the switching function of element 10, other suitable bistable electronic switches may be used instead. The principal requirement of switch 10 is that it have a main current path and a control terminal, the path being rendered conductive in response to one polarity of trigger pulse supplied to the control terminal and rendered non-conductive in response to an opposite polarity trigger pulse applied to the control terminal.

In operation of the circuit described thus far, a positive trigger pulse applied to trigger terminal 22 is conducted to gate terminal 24 through diode 20. This renders switch 10 conductive and current flows from terminal 28 through load 26 and GCS 10 to ground 18. Switch 10 remains conductive after passage of the trigger pulse because of the bistable characteristic thereof as previously described. The remaining elements of FIG. 1 perform the function of producing an opposite polarity trigger pulse a predetermined time after switch 10 becomes conductive to return switch 10 to its previously non-conductive condition.

These remaining elements include resistor 32 connected between the emitter of PNP transistor 30 and circuit point 14. The base of transistor 30 is grounded and the collector thereof is connected to the base of NPN transistor 34 the collector of which is grounded. Circuit point 36 is connected to the emitter of transistor 34 and to one plate of capacitor 38 the other plate of which is grounded. Circuit point 36 is also connected to control terminal 40 by variable resistor 42 and to gate terminal 24 by diac 44.

In the quiescent condition of the circuit, that is, in the absence of a trigger pulse applied to terminal 22, GCS 10 is non-conductive. Terminal 28 is at a positive voltage level +V, as already indicated, and terminal 40 is at voltage level −V. The potential at circuit point 14 is substantially equal to +V, causing a current to flow through resistor 32 to turn on common base connected PNP transistor 30. The current flowing through the emitter-to-collector path of transistor 30 causes forward current to flow through the base emitter junction of transistor 34 turning this transistor on. The emitter-to-collector path of transistor 34 connected across capacitor 38 prevents the capacitor from accumulating charge. Circuit point 36 is substantially at ground potential and as terminal 22 is also at ground, there is substantially no potential difference across diac 44. Therefore, diac 44 is non-conductive.

Upon application of a positive trigger pulse to trigger terminal 22, GCS 10 is switched on as previously described. The potential at circuit point 14 becomes substantially equal to ground potential and this prevents further current flow through resistor 32 and transistors 30 and 34 turn off. Now capacitor 38 begins to charge via resistor 42 toward the voltage −V at terminal 40. Diac 44 has a threshold voltage $V_t$ which is less than −V and when circuit point 36 reaches $V_t$, the diac becomes conductive and applies a negative voltage pulse, to gate 24 of GCS 10. This turns off GSS 10 whereupon circuit point 14 returns substantially to the potential of +V. This returns the circuit to its quiescent condition, as already discussed.

The structure and operation of the embodiment just described illustrates several desirable features of the present invention. For example, the on-time of GCS 10 is determined principally by the values of −V, resistor 42, capacitor 38 and the threshold voltage $V_t$ of diac 44. The on-time is not a significant function of the supply potential +V or of the characteristics of load 10. In other words, the on-time of the monostable circuit of FIG. 1 is substantially independent of and unaffected by the load parameters and the operating potential. Another feature of the present invention is that the on-time may be either internally controlled, for example, by changing the value resistor 42 (or of capacitor 38), or it may be externally controlled by changing the value of control voltage −V. Thus, the circuit of FIG. 1 may be externally pulse width modulated where such control is desired. Still another feature of the present invention is the ability of the circuit to rapidly recover at the end of an on-time period to allow substantially immediate retriggering. This feature results because transistor 34 discharges capacitor 38 with a negligible time constant compared to its charging time constant. An additional aspect of this latter feature is that capacitor 38 discharges substantially all its charge when transistor 34 is turned on. This means that there is substantially no residual charge left in the capacitor which might, in some cases, introduce undesirable variations in the on-time period because of variations in residual charge levels.

Although a diac has been employed as a threshold detector in the circuit of FIG. 1, other suitable threshold conduction devices may be employed instead and there is no requirement of bilateral threshold conduction. That is, a suitable unilateral threshold conduction device or a different bilateral threshold conduction device may be substituted for diac 44 in FIG. 1.

Load 26 may be any suitable load device such as a resistor, motor, solenoid coil, lamp or other appropriate device. For example, if load 26 is a resistor, a useful output signal voltage may be obtained from circuit point 14 and will vary inversely with the load current. Where load 26 is reactive, in solenoid driver applications, for example, it may, in some cases, be necessary to provide a reverse biased diode across the load or a snubber network to the GCS to protect the switch from reactive current flow. Such minor additions are well known in the art.

In FIG. 2 load 26, GCS 10, diode 20, diac 44, resistor 42 and capacitor 38 are connected as in FIG. 1 except that diode 20 is oppositely poled to receive a negative trigger pulse at terminal 22 and conduct the negative trigger pulse to gate 24 of GCS 10. FIG. 2 also differs from FIG. 1 in that resistor 32 and transistors 30 and 34 are eliminated, being replaced by an additional diode 50 coupled at its anode to circuit point 36 and at its cathode to circuit point 14. Also, in FIG. 2, a control voltage $+V_c$ is applied to control terminal 40. The voltage $+V_c$ is more positive than the threshold voltage $V_t$ of diac 44.

In the quiescent state of the circuit of FIG. 2, assume that GCS 10 is conductive. (It will be shown later that GCS 10 becomes conductive each cycle and remains so until the next trigger pulse arrives at 22.) The potential at circuit point 14 is substantially at ground reference level 18 and a load current continuously flows through load 26. As terminal 40 is at the $+V_c$ and point 14 is at ground, current flows in the forward direction through diode 50 and circuit point 36 is clamped to a potential close to ground. This prevents charge from accumulating on capacitor 38 and causes diac 44 to be nonconductive.

Upon application of a negative trigger pulse to trigger terminal 22, GCS 10 switches off. The potential at circuit point 14 increases to substantially +V and, as +V is more positive than the potential at circuit point 36, diode 50 becomes reverse biased and cuts off. The current previously flowing through diode 50 is thus diverted to capacitor 38 causing a charge to accumulate therein which results in an increasing potential at circuit point 36. Diac 44 becomes conductive when the potential at circuit point 36 reaches its threshold value $V_t$ and applies a positive pulse to gate 24 of GCS 10. Gate controlled switch 10 turns on in response to this positive pulse and circuit point 14 returns to substantially ground level. Diode 50 again conducts, capacitor 38 discharges, the SCR 10 remains on until the next negative trigger pulse is received.

The invention embodied in the circuit of FIG. 2 has features similar to those previously discussed with regard to FIG. 1. For example, the off-time of GCS 10 is determined principally by the values of the control voltage $+V_c$ resistor 42, capacitor 38 and the threshold voltage of diac 44. The off-time is substantially independent of the load parameters and the operating potential +V. The off-time may be either internally controlled, for example by varying resistor 42 (or changing the value of capacitor 38) or it may be externally controlled by varying control voltage $+V_c$. Thus, the circuit of FIG. 2 may be pulse width modulated, if desired. Another feature of FIG. 2 is the ability of the circuit rapidly to return to its quiescent state after the interval $\Delta t$, where $\Delta t$ is the period between the time at which the leading edge of the trigger pulse occurs and the time at which the voltage at point 36 reaches $V_t$. This permits the circuit to be retriggered immediately after $\Delta t$. This feature results because when $V_t$ is reached, SCR 10 goes on very quickly and diode 50 discharges capacitor 38 through GCS 10 with a negligible time constant compared to the charging time constant concerned. Also, capacitor 38 is substantially fully discharged when GCS 10 is switched ON so that there is substantially no residual charge left in the capacitor which might otherwise introduce undesirable variations in the off-time period.

As in the circuit of FIG. 1, other suitable threshold conduction devices may be employed in place of diac 44 and load 26 may be any suitable device. If, for example, load 26 is a resistor, a useful output signal voltage may be taken from circuit point 14 which will vary inversely with the load current. Well known techniques, such as capacitor coupling or transformer coupling may be used to connect trigger terminal 22 to a pulse source in the event that the source does not produce zero referenced negative output pulses.

What is claimed is:

1. A monostable switching circuit for use with a load and a source of operating potential to control current flow through the load, comprising:

a bistable electronic switch having a conduction path for connection in circuit with the load and the source of operating potential, said switch having a control terminal responsive to a first polarity trigger signal for placing the path in a first conductive state and responsive to a second polarity trigger signal for placing the path in a second conductive state;

means for applying said first polarity trigger signal to said control terminal; and circuit means responsive to an externally supplied control signal and to the conductive state of said path for producing and applying said second polarity trigger signal to said control terminal a predetermined time, which is a function of the value of said externally supplied control signal and is substantially independent of said current flow through said load, after application of said first polarity trigger signal.

2. The switching circuit recited in claim 1 wherein said bistable electronic switch comprises a gate controlled thyristor switch having anode, cathode and gate terminals, the anode-to-cathode conduction path thereof for connection in series circuit with said load, said gate terminal for receiving said first and second polarity trigger signals and controlling the conductive state of said anode-to-cathode conduction path in accordance therewith said anode terminal being coupled to said circuit means for providing a feedback signal thereto representative of said conductive state of said path.

3. The switching circuit recited in claim 1 wherein said circuit means comprises:
a capacitor;
means for applying a charging current to said capacitor in response to said externally supplied control signal, said charging current being in a sense to produce a voltage at the capacitor of said second polarity;
threshold conduction means responsive to said second polarity voltage for forming said second polarity trigger signal in response thereto when said second polarity voltage is of a threshold value and applying said second polarity trigger signal to said control terminal; and
further means coupled to said capacitor for continuously providing a discharge path for said capacitor of substantially negligible impedance when said conduction path is in one of said conductive states, said further means effectively opening said discharge path when said conduction path is in the other of its conductive states.

4. The combination recited in claim 3 wherein said further means comprises:
a diode coupled between one end of said conduction path and said capacitor, said diode poled to discharge the capacitor when said conduction path is in said second conductive state.

5. The combination recited in claim 3 wherein said further means comprises:
switch means connected across said capacitor, said switch means being responsive to said second conductive state of said conduction path for discharging said capacitor and to said first conductive state of said conduction path for enabling charging of said capacitor.

6. The combination recited in claim 3 wherein said threshold conduction means comprises a thyristor having a conduction path connected between said capacitor and said control terminal, the thyristor conduction path being rendered conductive in response to a potential thereacross of said threshold voltage and remaining conductive thereafter for a current flow therethrough of greater than a minimum value.

7. A monostable switching circuit for controlling current through a load, comprising:
a gate controlled switch having a conduction path for connection in series with the load, said switch having a gate terminal responsive to a first polarity trigger signal for placing the path in a first conductive state and responsive to a second polarity trigger signal for placing the path in a second conductive state;
means for applying the first polarity trigger signal to said gate terminal for placing said path in said first conductive state;
a capacitor;
means for applying a charging current to the capacitor in response to an externally supplied control signal in a sense to produce a signal of said second polarity, said charging current being independent of current flow through said switch;
threshold conduction means coupled between the capacitor and said gate terminal for conducting the second polarity trigger signal therebetween when the capacitor voltage exceeds a threshold value; and
means responsive to the conductive state of the path for discharging the capacitor when the path is in said second conductive state and for enabling charging of said capacitor when said path is in said first conductive state.

8. The circuit recited in claim 7 wherein said means responsive to the conductive state of the path comprises:
a diode coupled between said capacitor and one end of said conduction path, said diode being poled to discharge said capacitor when said conduction path is in a selected one of said conductive states.

9. The circuit recited in claim 7 wherein said means responsive to the conductive state of the path comprises
a further switch coupled across said capacitor, said further switch being responsive to a selected one of said conductive states of said conduction path for discharging said capacitor.

10. In combination:
first and second circuit points, the first for connection to a load, the second for connection to a source of reference potential
a gate controlled switch having an anode-to-cathode conduction path with anode and cathode terminals at the ends thereof, the anode terminal being connected to said first circuit point, the cathode terminal being connected to said second circuit point, said switch having a gate terminal, said gate terminal being responsive to a first polarity trigger signal for placing the anode-to-cathode path of said switch in a first conductive state and responsive to a second polarity trigger signal for placing the anode to cathode path in a second conductive state;
means for applying said first polarity trigger signal to said gate terminal for placing said path in said first conductive state;
a capacitor having two terminals, one of said terminals connected to said second circuit point;
charging means coupled to the other terminal of said capacitor for supplying a charging current thereto in accordance with an externally supplied control signal and in a sense to charge said capacitor to a voltage of said second polarity;
threshold conduction means coupled between said other plate of said capacitor and said gate terminal for forming said second polarity trigger pulse when said voltage exceeds a threshold value and applying said second polarity trigger pulse to said gate terminal;
means connected to said anode terminal and responsive to the conductive state of said anode-to-cathode path for discharging said capacitor when the path is in said second conductive state and for enabling charging of said capacitor by said charging means when said path is in said first conductive state.

11. The combination recited in claim 10 wherein said means responsive to the conductive state of said anode-to-cathode path comprises a diode coupled at the anode thereof to said other terminal and at the cathode thereof to said anode terminal of said gate controlled switch.

12. The combination recited in claim 10 wherein said means responsive to the conductive state of said anode-to-cathode path comprises a transistor switch connected across said capacitor, said switch being responsive to a selected one of said conductive states of said anode-to-cathode conduction path for discharging said capacitor.

13. In combination;

a bistable circuit element having a conduction path connected between a point of reference potential and a second circuit point and control electrode means for controlling the conductivity of said path, said bistable circuit normally assuming one of its stable states;

means for applying a trigger signal to said control electrode means for switching said circuit element to its other stable state;

charge storage means;

further means coupled to said charge storage means for continuously providing a discharge path for said charge storage means of substantially negligible impedance when said bistable circuit element is in said one of its stable states, said further means effectively opening said discharge path when said bistable circuit element is in said other stable state;

means responsive to the voltage present at said second circuit point when said bistable circuit element is switched to its second state for causing said charge storage means to charge in accordance with an externally supplied control signal; and means responsive to the voltage at said charge storage means reaching a given level for applying a trigger signal to said control electrode means for switching said circuit element back to its initial state.

14. The combination recited in claim 13 wherein said bistable circuit elements comprise a gate controlled switch having anode, cathode and gate terminals, said anode terminal being connected to said second circuit point, said cathode being connected to said point of reference potential and said gate terminal corresponding to said control means for receiving said trigger signals.

15. The combination recited in claim 13 wherein said means responsive to the voltage present at said second circuit point comprises:

a control terminal for receiving said externally supplied control signal;

means coupled between said control terminal and said charge storage means for conducting a charging current therebetween; and wherein said further means comprises:

a diode connected between said charge storage means and said second circuit point, said diode being poled to conduct a current therebetween when said bistable circuit element is in said one of its stable states.

16. The combination recited in claim 13 wherein said means responsive to the voltage present at said second circuit point comprises a control terminal for receiving said externally supplied control signal;

means coupled between said control terminal and said charge storage means for conducting a charging current therebetween; and wherein said further means comprises:

switch means having a conduction path and a control electrode, said conduction path being connected between said point of reference potential and said charge storage means, said control electrode being coupled to said second circuit point, said conduction path being normally conductive when said bistable circuit element is in said one of its stable states.

* * * * *